(12) United States Patent
Bialas, Jr. et al.

(10) Patent No.: US 7,240,263 B2
(45) Date of Patent: Jul. 3, 2007

(54) APPARATUS FOR PERFORMING STUCK FAULT TESTINGS WITHIN AN INTEGRATED CIRCUIT

(75) Inventors: John Stanley Bialas, Jr., South Burlington, VT (US); Ralph D. Kilmoyer, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 10/906,448

(22) Filed: Feb. 21, 2005

(65) Prior Publication Data

US 2006/0242505 A1     Oct. 26, 2006

(51) Int. Cl.
    *G01R 31/28* (2006.01)
(52) U.S. Cl. .............. 714/726; 708/232; 713/401; 327/269
(58) Field of Classification Search .............. None
    See application file for complete search history.

(56) References Cited

U.S. PATENT DOCUMENTS 4,195,352 A * 3/1980 Tu et al. .................... 708/232
5,881,068 A * 3/1999 Kim et al. .................. 714/726
6,380,785 B2 * 4/2002 Fisher ....................... 327/269
6,795,931 B1 * 9/2004 LaBerge ..................... 713/401
2003/0126530 A1 * 7/2003 Larson et al. ............... 714/724

OTHER PUBLICATIONS

"74VHCT138A 3-to-8 Decoder/Demultiplexer", Fairchild Semiconductor Corp., at www.fairchildsemi.com, 1999, DS500014.prf.*

* cited by examiner

*Primary Examiner*—Guy Lamarre
*Assistant Examiner*—John P. Trimmings
(74) *Attorney, Agent, or Firm*—Michael J. LeStrange; Dillon & Yudell LLP

(57) ABSTRACT

An apparatus for performing stuck fault testings within an integrated circuit is disclosed. A delay chain structure includes a first select register, a second select register, a decoder and a chain of multiplexors. With a set of select signals, the first select register generates a set of true encoded select signals, and the second select register generates a set of complement encoded select signals. Coupled to the first and second select registers, the decoder decodes the set of true encoded select signals and the set of complement encoded signals for controlling the chain of multiplexors. Each multiplexor within the chain of multiplexors is connected to one of the outputs of the decoder. The chain of multiplexors generates a single output value based on the set of select signals.

6 Claims, 4 Drawing Sheets

APPARATUS FOR PERFORMING STUCK FAULT TESTINGS WITHIN AN INTEGRATED CIRCUIT

BACKGROUND OF THE INVENTION

1. Technical Field

The present invention relates to testing tools in general, and, in particular, to an apparatus for testing logic circuits. Still more particularly, the present invention relates to an apparatus for performing stuck fault testings within an integrated circuit.

2. Description of Related Art

Level-sensitive scan design (LSSD) tests are utilized to test the logic within integrated circuit devices in a reliable and efficient manner. During an LSSD testing, a chain of shift register latches (SRLs) is coupled to the inputs and outputs of an internal logic under test (LUT). Test data is scanned serially into one chain (i.e., the input chain) of the SRLs. When the input shift register is full, the data propagate through the LUT, and the data are then written into a second chain (i.e., the output chain) of the SRLs. The acquired data are then scanned serially out and compared to the expected data. If the acquired data do not match the expected data, the LSSD test will indicate that the LUT is not functioning properly. Such type of general functionality tests is commonly referred to as a stuck fault testing because it determines the existence of permanent (or stuck) errors in the LUT.

However, in addition to confirming the functionality of the LUT, it is also desirable to check the propagation delay through the LUT. That is, even when the stuck fault testing confirms that the LUT achieves the desired function, the corresponding circuit will not meet its performance specifications if it cannot produce the logic signals within an allocated time. The tests that determine propagation delays and detect propagation delay failures are commonly referred to as performance fault (or transition fault) testings.

The present disclosure provides an improved apparatus for performing stuck fault testings within integrated circuits.

SUMMARY OF THE INVENTION

In accordance with a preferred embodiment of the present invention, a delay chain structure includes a first select register, a second select register, a decoder and a chain of multiplexors. With a set of select signals, the first select register generates a set of true encoded select signals, and the second select register generates a set of complement encoded select signals. Coupled to the first and second select registers, the decoder decodes the set of true encoded select signals and the set of complement encoded signals for controlling the chain of multiplexors. The select control of each multiplexor within the chain of multiplexors is connected to one of the outputs of the decoder. The chain of multiplexors generates a single output value based on the set of select signals.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

In order to perform stuck fault testings and performance testings, a critical path is defined within a logic under test (LUT), and test signals must propagate through the critical path within a predetermined amount of time. Stuck fault test results are provided by comparing the expected data to the acquired data as described above. Performance test results indicate signals that do not propagate through the critical path of the LUT within a predetermined amount of time.

Figure 1:
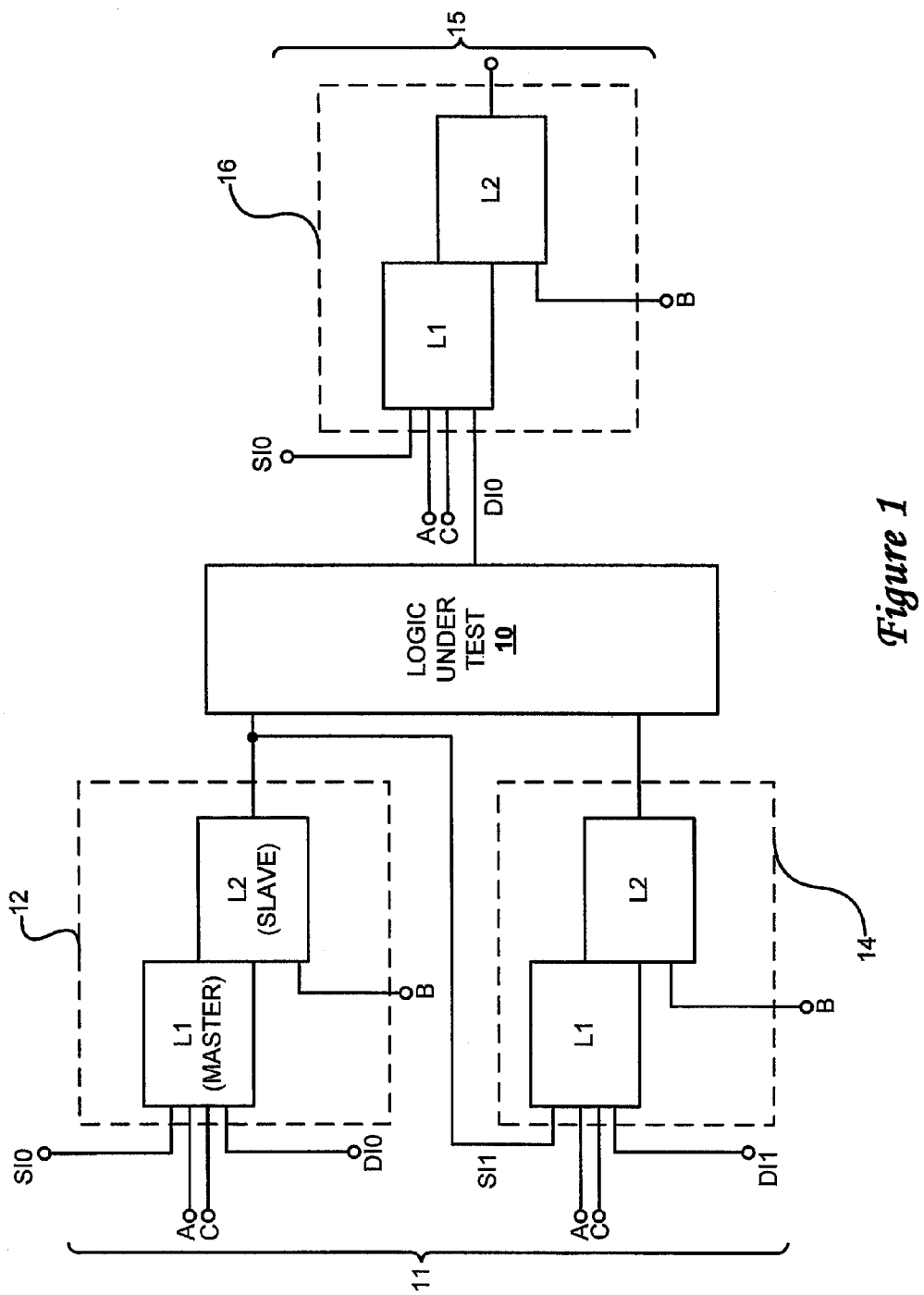
FIG. 1 is a block diagram of two chains of shift register latches in which a preferred embodiment of the present invention is incorporated.

Referring now to the drawings and in particular to FIG. 1, there is depicted a block diagram of two chains of shift register latches (SRLs) in which a preferred embodiment of the present invention is incorporated. As shown, an input SRL chain 11 and an output SRL chain 15 are connected to a logic under test (LUT) 10. Input SRL chain 11 is made up of a SRL 12 and a SRL 14. Each of SRLs 12 and 14 includes a master latch L1 and a slave latch L2. Master latch L1 of SRL 12 includes clock signal inputs A–C, a level-sensitive scan design (LSSD) scan signal input SI0 and a functional data signal input DI0. Slave latch L2 of SRL 12 receives an output from master latch L1 (not shown) and a clock signal input B. The output of slave latch L2 of SRL 12 is connected to an LSSD scan data input SI1 of master latch L1 of SRL 14. Except for the LSSD scan data signal input SI1, the remaining inputs to SRL 14 are the same as those of SRL 12 described above. For output SRL chain 15, a DI0 input to a master latch L1 of SRL 16 is taken from an output of LUT 10. The remaining elements of output SRL chain 15 receive the same inputs and provide substantially the same functions as input SRL chain 11 described above.

During operation, data are acquired by master latch L1 of SRL 12 at data signal input DI0 by pulsing clock signal input C of master latch L1 of SRL 12. Data are then sent from master latch L1 of SRL 12 to slave latch L2 of SRL 12 by pulsing clock signal input B of slave latch L2 of SRL 12. After pulsing clock signal input A of master latch L1 of SRL 14, data are sent from slave latch L2 of SRL 12 to master latch L1 of SRL 14.

Figure 2:
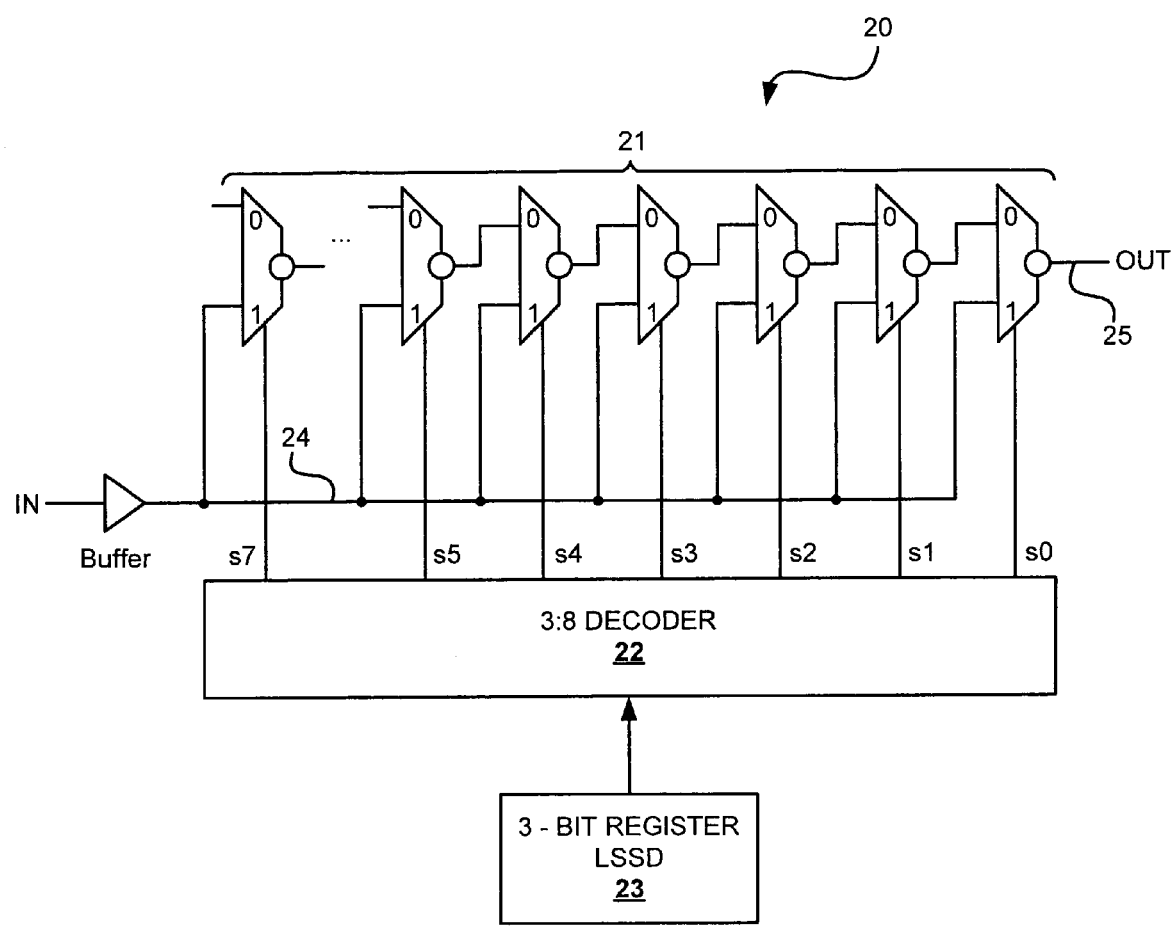
FIG. 2 is a block diagram of a delay chain structure, according to the prior art.

With reference now to FIG. 2, there is depicted a block diagram of a delay chain structure, according to the prior art. As shown, a delay chain structure 20 includes a multiplexor chain 21 coupled to a decoder 22 and an encoded select register 23. Delay chain structure 20 is utilized to generate proper clock-to-data phase relationships for data capture in source synchronous link and double-data rate (DDR) type memory interface. Delay chain structure 20 is fully digital in nature and utilizes the delay of multiplexor chain 21 to insert the required delay in a data and/or clock path 24.

As a digital structure, testability requirements dictate that delay chain structure 20 be fully testable to a level of, for example, 99.80% with no untestable faults. As shown in FIG. 2, delay chain structure 20 includes multiplexor chain 21 as delay elements, decoder 22 and select register 23. Decoder 22 is considered as "1 hot" because for any combination of encoded select inputs, one and only one select input can be active. Such selected input represents an insertion point for an input signal to be inserted into multiplexor chain 21. The input signal then propagates through the rest of multiplexor chain 21 to an output 25. Decoder 22 is a decoder that is utilized to generate select inputs to an n-wide multiplexor. For example, as shown in FIG. 2, decoder 22 is a 3:8 decoder for generating eight selects to control over which one of eight data inputs S0–S7 should be selected for output.

Testbench™ tool is a preferred software tool commonly utilized for performing LSSD stack fault testings. With Testbench™ tool, an insertion point is selected for an input signal to enter multiplexor chain 21. The input signal then propagates from the insertion point to output 25. All delay circuits preceding the insertion point are blocked from propagating to output 25 by one of selected insertion multiplexor chain 21. The problem is rooted within decoder 22 in that the test patterns are attempting to test all the nodes within decoder 22. As with the multiplexor example, all test results must be propagated through a single output. However, many of the test pattern results are blocked from propagating to output 25 because every combination of encoded select inputs decodes to the insertion point, blocking all results from propagating upstream of the insertion point in multiplexor chain 21.

As an example, after a 64-stage delay chain with a 6:64 decoder was run through the Testbench™ tool, the Testbench™ tool identified 880 stuck faults to be tested, of which 645 were testable, 233 were redundant, and 2 were untestable. Such scenario equates to 73.3% testable, which is far from the above-mentioned level of 99.8% with no untestable target. A potential solution to the above-mentioned problem is to source each decoded select from a LSSD latch. Then, the Testbench™ tool has full control over the individual selects and can fully test the delay chain structure. However, an LSSD latch is approximately three times the size of a delay element, and because an LSSD latch would be required for each delay element, the result of such an approach would lead to an area increase of approximately four times the area consumed by the delay chain elements alone.

In accordance with a preferred embodiment of the present invention, an encoded select source, such as select register 23 in FIG. 2, is broken into two separate groups of latches. The first group of latches supplies the encoded values to the decode logic that selects the early multiplexors in a delay chain that are targeted for testing. The second group of latches supplies the encoded values to the decode logic that would normally block the propagation of the test results from the early circuits through the rest of the delay chain. Because the latches supplying the selects to the early part of the delay chain and the latches supplying the selects to the late part are being separately controlled, blocked fault propagation of the test results can be eliminated.

The present invention involves a change in the way an encoded select value is presented to a decoder such that the decoder is no longer the "1 hot" structure during stuck fault testing but retains its "1 hot" structure during functional operations. The "1 hot" decoder of the present invention operates by generating the complement of each true encoded input, and ANDing all possible combination of true and complement inputs to generate the "1 hot" selects. For example, a 3:8 decoder can generate 8 decoded selects from three encoded inputs for every binary combination of the three encoded inputs. The decoder of the present invention relaxes such strict 3:8 mapping of the selects by providing the decoder with both the true and complement encoded select values, all sourced directly from LSSD latches. Such a structure is shown in FIG. 3.

Figure 3:
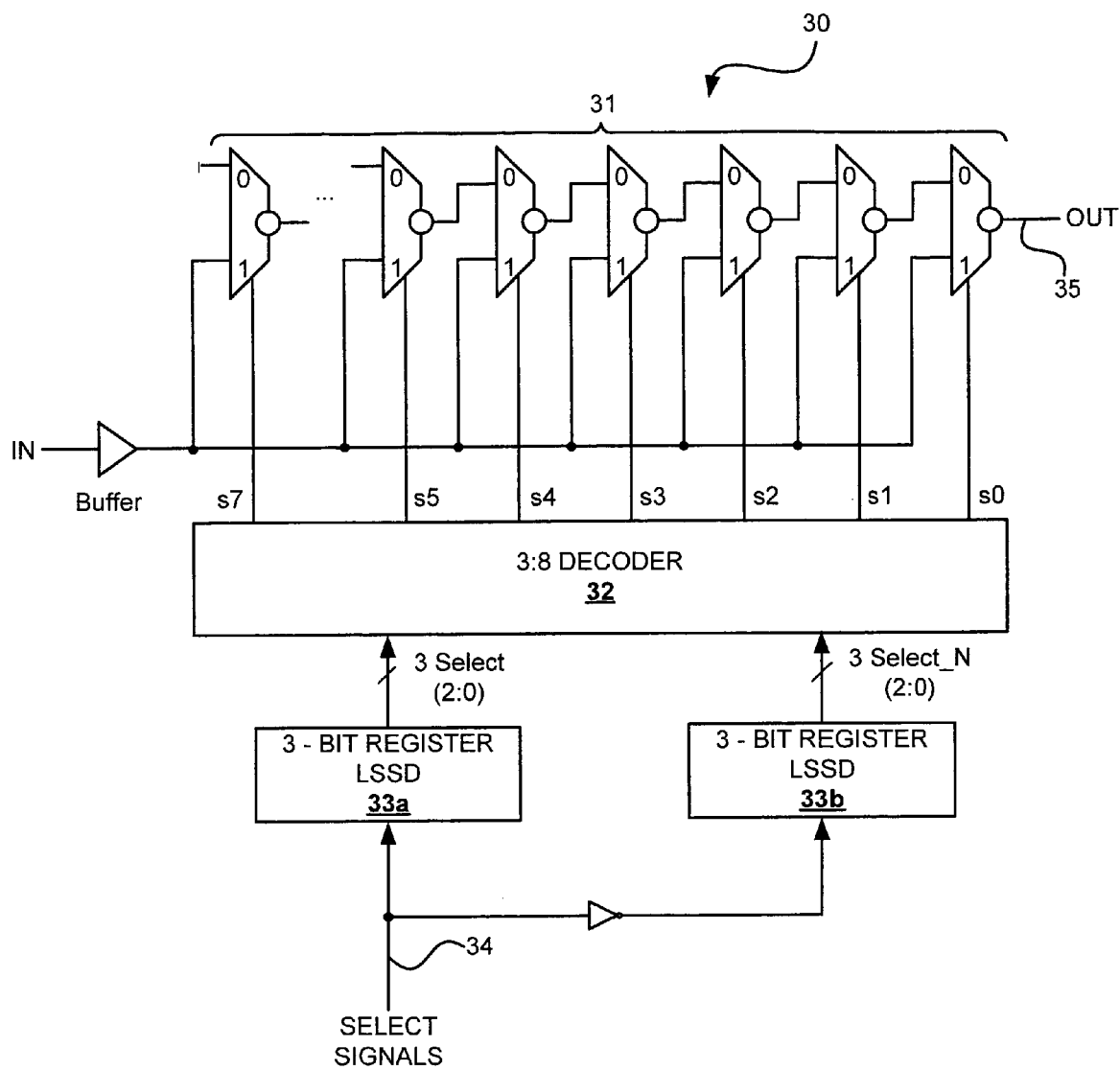
FIG. 3 is a block diagram of a delay chain structure, in accordance with a preferred embodiment of the present invention.

Referring now to FIG. 3, there is depicted a block diagram of a delay chain structure, in accordance with a preferred embodiment of the present invention. As shown, a delay chain structure 30 includes a series of multiplexors 31 coupled to a decoder 32, a first encoded select register 33a and a second encoded select register 33b. Select signals are sent to both first encoded select register 33a and second encoded select register 33b via an input 34. Specifically, first encoded select register 33a receive the select signals directly, while second encoded select register 33b receive the complements of the select signals. In turn, first encoded select register 33a is responsible for sending only true encoded select signals to decoder 32, and second encoded select register 33b is responsible for sending only complement encoded select signals to decoder 32.

Basically, first encoded select register 33a and second encoded select register 33b decouple the true and complement portions of the select signals intended for decoder 32 from each other. The de-coupling of the select signals intended for decoder 32 essentially allows any combination of select signals to be applied to decoder 32 to generate a decoded select without that same set of patterns selecting an insertion point within multiplexor chain 31 that would prevent the results of the decoded select from being propagated to an output 35. As such, all circuits within decoder 32 can now be tested. Testbench results for stuck fault coverage on the preferred embodiment are 100.00%.

Figure 4:
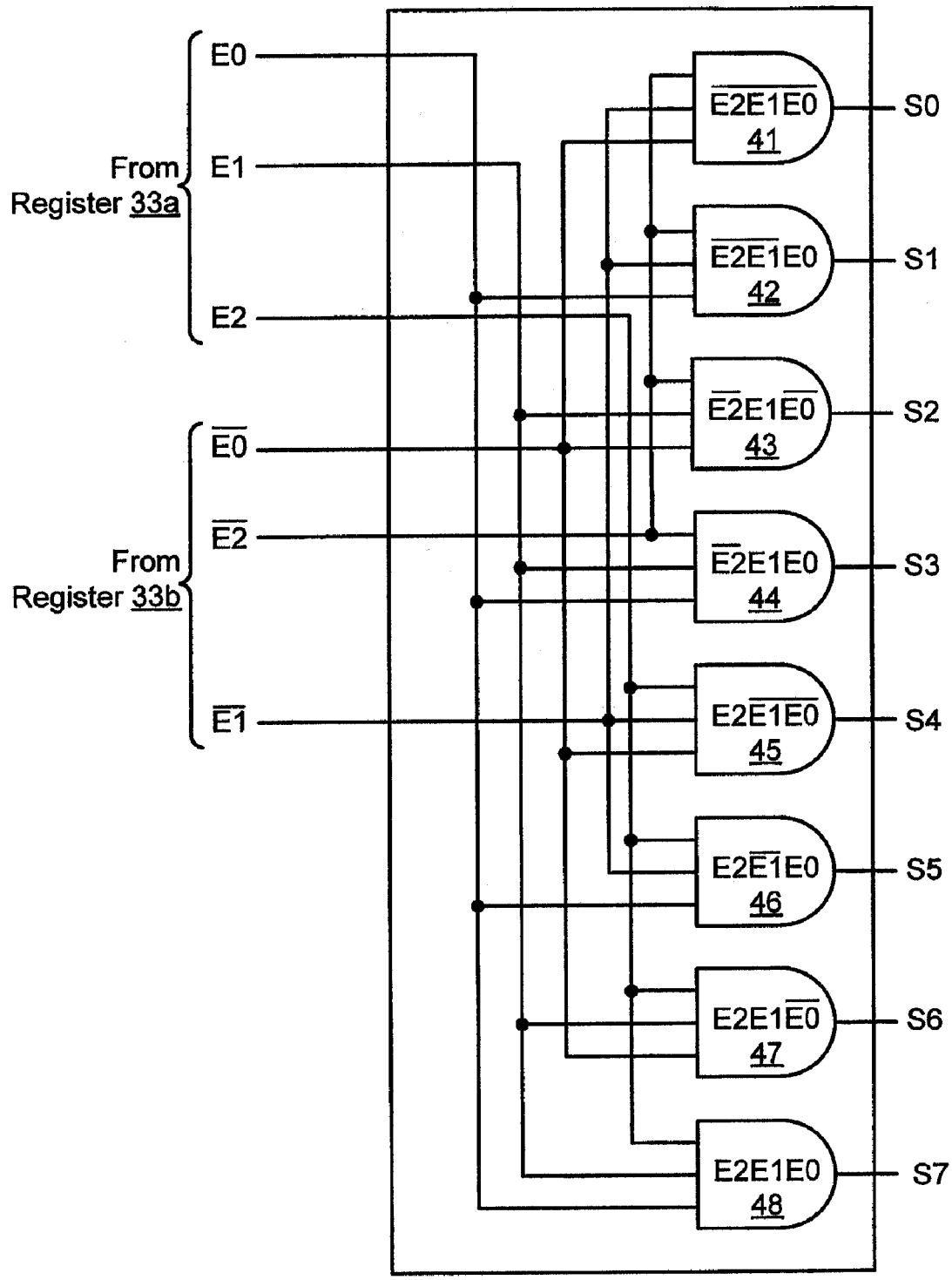
FIG. 4 is a circuit diagram of a decoder within the delay chain structure from FIG. 3, in accordance with a preferred embodiment of the present invention.

With reference now to FIG. 4, there is illustrated a circuit diagram of decoder 32, in accordance with a preferred embodiment of the present invention. As shown, decoder 32 includes AND gates 41–48. Inputs to AND gates 41–48 are divided into two separate groups. The first group of inputs is provided by select register 33a (from FIG. 3) and the second group of inputs is provided by select register 33b (from FIG. 3). In the present embodiment, select register 33a provides inputs E0, E1 and E2 to decoder 32, and select register 33b provides inputs E0bar, E1bar and E2bar, and to decoder 32. By utilizing inputs from select register 33a and select register 33b, AND gates 41–48 generate S0–S7, respectively.

As has been described, the present invention provides an apparatus for performing stuck fault testings within an integrated circuit. Although decoder 32 is preferably made up of AND gates, it is understood by those skilled in the art that decoder 32 can be implemented by any type of logic gates.

While the invention has been particularly shown and described with reference to a preferred embodiment, it will be understood by those skilled in the art that various changes in form and detail may be made therein without departing from the spirit and scope of the invention.

What is claimed is:

1. An apparatus for performing level-sensitive scan design (LSSD) tests, said apparatus comprising:
   a first select register for generating a set of true encoded select signals from a set of select signals;
   a second select register for generating a set of complement encoded select signals from said set of select signals;
   a decoder, coupled to said first and second select registers, for receiving said set of true encoded select signals and said set of complement encoded signals, wherein said decoder includes a plurality of outputs, and one of said plurality of outputs is activated based on either said set of true encoded select signals or said set of complement encoded signals; and a plurality of multiplexors connected in series to form a delay chain to provide appropriate delays for an input signal during an LSSD test, wherein each of said plurality of multiplexors is connected to one of said plurality of outputs from said decoder, wherein one of said plurality of multiplexors is selected based on said activated output during said LSSD test.

2. The apparatus of claim 1, wherein said decoder includes a plurality of AND gates.

3. The apparatus of claim 1, wherein said apparatus further includes an inverter for converting said set of true encoded select signals to said set of complement encoded select signals.

4. A method for performing level-sensitive scan design (LSSD) tests, said method comprising:

generating a set of true encoded select signals from a set of select signals;

generating a set of complement encoded select signals from said set of select signals;

separately decoding said set of true encoded select signals and said set of complement encoded signals;

activating a corresponding one of a plurality of outputs based on either said set of true encoded select signals or said set of complement encoded signals; and selecting one of a plurality of delay elements within a delay chain based on said activated output, wherein said delay chain is for providing appropriate delays to a data input during LSSD tests.

5. The method of claim 4, wherein said activating is performed by a decoder.

6. The method of claim 4, wherein said plurality of delay elements are multiplexors.

* * * * *